(12) United States Patent
Saeki et al.

(10) Patent No.: US 7,345,602 B2
(45) Date of Patent: Mar. 18, 2008

(54) PRE-EMPHASIS CIRCUIT

(75) Inventors: Takanori Saeki, Kanagawa (JP);
Yasushi Aoki, Kanagawa (JP); Tadashi Iwasaki, Kanagawa (JP); Toshihiro Narisawa, Kanagawa (JP); Makoto Tanaka, Kanagawa (JP); Yoichi Iizuka, Kanagawa (JP); Nobuhiro Ooki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/493,602

(22) Filed: Jul. 27, 2006

(65) Prior Publication Data

US 2007/0024476 A1    Feb. 1, 2007

(30) Foreign Application Priority Data

Jul. 28, 2005  (JP)  ............................. 2005-219345

(51) Int. Cl.
*H03M 9/00*  (2006.01)
(52) U.S. Cl. ...................... 341/101; 341/100
(58) Field of Classification Search ......... 341/100–101
See application file for complete search history.

(56) References Cited

U.S. PATENT DOCUMENTS

| | | | |
|---|---|---|---|
| 4,799,040 A * | 1/1989 | Yanagi | 341/101 |
| 6,150,965 A * | 11/2000 | Carr et al. | 341/101 |
| 6,292,116 B1 * | 9/2001 | Wang et al. | 341/100 |
| 6,674,313 B2 | 1/2004 | Kurisu et al. | |
| 6,791,483 B2 * | 9/2004 | Hattori | 341/101 |
| 6,806,819 B2 * | 10/2004 | Hoffmann | 341/100 |
| 6,897,685 B2 | 5/2005 | Sato | |

FOREIGN PATENT DOCUMENTS

| JP | 2002-094365 A | 3/2002 |
|---|---|---|
| JP | 2004-088693 A | 3/2004 |

OTHER PUBLICATIONS

T. Tanahashi et al., "A 2Gb/s 21CH Low-Latency Transceiver Circuit for Inter-Processor Communication," ISSCC-2001, Session 4 High Speed Digital Interfaces, 2 pp., pp. 60-61, no month.

* cited by examiner

*Primary Examiner*—Khai M. Nguyen
(74) *Attorney, Agent, or Firm*—Foley & Lardner LLP

(57) ABSTRACT

Disclosed is a pre-emphasis circuit including a first parallel-to-serial converter, a second parallel-to-serial converter, a mixing circuit and a clock generating circuit. The first parallel-to-serial converter converts parallel data into first serial data, and the second parallel-to-serial converter converts the parallel data into second serial data. The mixing circuit receives the first serial data from the first parallel-to-serial converter and the second serial data from the second parallel-to-serial converter to output a signal emphasizing a change point of the first serial data. The clock generating circuit outputs a first set of clocks made up of clocks having mutually different phases and a second set of clocks made up of clocks having mutually different phases to the first and second parallel-to-serial converters, respectively. The first phase clock of the second set of clocks corresponds to the second phase clock of the first set of clocks.

8 Claims, 12 Drawing Sheets

PRE-EMPHASIS CIRCUIT

FIELD OF THE INVENTION

This invention relates to a pre-emphasis circuit and, more particularly, to a circuit that may be applied with advantage to a serial interface adapted for converting parallel data to serial data, pre-emphasizing the serial data and outputting the resulting data to a transmission line.

BACKGROUND OF THE INVENTION

An output buffer circuit for outputting a logic signal on a transmission line which behaves as a distributed parameter circuit, is equipped with a pre-emphasis function which pre-emphasizes a signal waveform, in accordance with signal attenuation occurring on the transmission line, to output the resulting signal waveform. As this sort of the output buffer, there has so far been used a circuit configured as a differential data driver shown for example in FIG. 9 (see Patent Document 1). Referring to FIG. 9, this differential data driver includes two pre-driver circuits 61 and 62, a delay circuit 60 and a final stage driver circuit 63. This final stage driver circuit 63, which generates a pre-emphasis signal form output signals of the two pre-driver circuits 61 and 62, is composed by a subtraction circuit. The subtraction circuit subtracts output signals of the two pre-driver circuits 61 and 62 one from the other to generate a pre-emphasis waveform signal. The differential input signal (input positive/negative) is branched into two paths. One of the paths or a first path transfers the data signal unchanged, while the other path or a second path transfers a signal which emphasizes the data signal. On the first path, the pre-driver circuit 61 buffers the data signal to supply the so buffered data signal to the final stage driver circuit 63. On the second path, a certain delay time is added to the data signal by a delay circuit 60 and the output signal of the delay circuit 60 is buffered by the second pre-driver circuit 62. The so buffered data signal is supplied to the final stage driver circuit 63 with a signal delay by a delay circuit 60. In the final stage driver circuit 63, the two signals are subtracted one from the other to generate a differential output signal having a pre-emphasized waveform. The final stage driver circuit 63 is composed by a differential circuit which comprises a first differential pair, not shown, and a second differential pair, also not shown. The first differential pair, receiving differential data signals from the pre-driver circuit 61, has sources connected in common and connected to a constant current source. The second first differential pair, receiving delayed differential data signals from the path of the delay circuit 60, has sources connected in common and connected to another constant current source. An output pair of the first and second differential pairs is connected in common to a load circuit, not shown. The delay time by the delay circuit 60 prescribes the time of pre-emphasis. The delay circuit 60 may be formed by, for example, a buffer line or a D-type flip-flop.

Meanwhile, as a CMOS driver circuit, outputting a single in a single ended way, reference may be had to Non-Patent Document 1 and to Patent Document 2. The Patent Document 2 discloses a configuration shown for example in FIG. 10. In this configuration, a current bit SO1 from a terminal TA is supplied to an inverter IN1, an output of which is supplied to a first output buffer B1, that is, to a common gate of a first CMOS inverter made up of a PMOS transistor P1 and an NMOS transistor N1, connected in series between a power supply VDD and another power supply VSS. An inverted delayed bit signal SO2 from a terminal TB is supplied to an inverter INV2, an output of which is supplied to a second output buffer B2, that is, to a common gate of a second CMOS inverter made up of a PMOS transistor P2 and an NMOS transistor N2, connected in series between the power supply VDD and the power supply VSS. Outputs of the first and second buffers B1 and B2 are connected in common and connected to one end of a transmission line L. The output impedance of the second output buffer B2 is set so as to be higher than that of the first output buffer B1. The opposite end of the transmission line L is connected via a terminating resistor Rt to a terminating potential VTT. There is also disclosed in Non-Patent Document 1 a configuration which is a modification of the configuration of FIG. 10. The configuration of the Non-Patent Document 1 includes a clocked inverter, that is, a buffer having output impedance varied by an emphasis control signal. In this clocked buffer, an NMOS transistor and a PMOS transistor, the gates of which are supplied with an emphasis control signal and an inverted signal thereof and which are thereby on/off controlled, are connected, along with a second CMOS inverter, between the power supply and the ground. The common gate of the second CMOS inverter receives an inverted signal of an inverted delay bit signal SO2 of FIG. 10. Outputs of the first output buffer and the clocked inverter are connected together and connected to the transmission line.

As a transmission equalizer, a 5-tap 2 PAM/4-PAM equalizing transmitter, shown in FIG. 11, has also been proposed.

There is also proposed a driver circuit having a 10:1 MUX (pre-emphasis MUX and data MUX) provided with feedback control of the load resistor, as shown in FIG. 12.

In the above-described state-of-the-art pre-emphasis circuit, data delayed by one clock is generated by shifting serial data. Or, a differential circuit is used to generate delayed data by shifting from one latch to another by multi-phased clocks. This may give rise to a problem that the circuit area as well as power consumption is increased.

FIG. 6 shows a configuration of a state-of-the-art pre-emphasis circuit including a D-type flip-flop (FF) 111, as a delay circuit, in which serial data from a parallel-to-serial converter 101 is delayed by the D-type flip-flop 111 and supplied as an input to a mixing circuit (MIX) 103. An divided by 8/8-phase clock generating circuit 102 generates eight phase clocks based on clocks obtained on dividing-by eight a clock signal CLK. The eight phase clocks are clocks phase-shifted from one another by tCLK and having a pulse width equal to tCLK, where tCLK is a clock period. The parallel-to-serial converter 101 outputs in serial data of 8 bit parallel TXDAT [7:0], responsive to clock pulses of the respective phases of divided-by 8 eight phase clocks. The serial data A from the parallel-to-serial converter 101 is delayed by one clock period tCLK by the D-type flip-flop 111 so as to be output as serial data B (see FIG. 7). The serial data A and inverted bits of the serial data B are supplied as input to the mixing circuit 103 in order to effect pre-emphasis (or de-emphasis). FIG. 7 is a timing diagram for illustrating the operation of the configuration of FIG. 6. This configuration is required to effect a high speed operation of the shift circuit, thereby leading to increased latency and lowering of the upper limit of high speed operation.

In case the configuration, shown in FIG. 6, is applied to a serialization part a known interface including a serialization/deserialization circuit, required to perform a high speed operation, as shown in FIG. 8, various constraints, including increased latency and suppression of operational limits, are imposed. Meanwhile, the parallel-to-serial converter 101, shown in FIG. 8, adapted for converting eight bit parallel transmission data TXDAT [7:0] into serial data, corresponds to the parallel-to-serial converter 101, shown in FIG. 6. Referring to FIG. 8, a reference numeral 110 denotes a pre-emphasis circuit and a reference numeral 104 denotes an output buffer. It is noted that received differential data RXT and RXC are supplied to an input buffer 105, and that data and clocks, synchronized with the input data, are extracted by a clock and data recovery (CDR) circuit 106. The data from the clock and data recovery circuit 106 are converted by a serial-to-parallel converter 108 to received parallel data RXDTA [7:0], which then is supplied to an internal circuit, not shown. The serial-to-parallel converter 108 is supplied with an output from a counter 107 adapted for generating clocks by frequency division based on the clock signal from the clock and data recovery circuit 106. A phase locked loop (PLL) 109 generates an internal clock signal synchronized with a system clock signal SCLK.

[Patent Document 1]
JP Patent Kokai Publication No. JP-P2004-88639A
[Patent Document 2]
JP Patent Kokai Publication No. JP-P2002-94365A
[Non-Patent Document 1]
Toshio Tanahashi et al. "A 2 Gb/s 21CH Low-Latency Transceiver Circuit for Inter-Processor Communication", ISSCC2001 Digest of technical papers p.p. 60-61

SUMMARY OF THE DISCLOSURE

The pre-emphasis circuit generates the data delayed by one clock period by shifting the serial data, as described above. Or, using a differential circuit, the pre-emphasis data is generated by shifting latch with multi-phase clocks. This gives rise to the following problems.

Since data delayed by one clock period is generated by shifting the serial data, the circuit area is increased, while the power consumption is also increased.

Since the shifting circuit is operated at a high speed, the latency is increased, while the limit on the high speed operation tends to be lowered.

Moreover, since the differential circuit is used, the power consumption is also increased.

Thus, due to many constraints, it is extremely difficult to apply the state-of-the-art designing system of the pre-emphasis circuit to an interface including a serialization/deserialization circuit, required to perform a high speed operation.

The present invention is configured substantially as follows:

According to the present invention, the delayed data is generated by carrying out parallel-to-serial conversion in parallel.

More specifically, a pre-emphasis circuit in accordance with one aspect of the present invention includes: a first parallel-to-serial converter for converting parallel data into serial data, wherein. the pre-emphasis circuit generates, from first serial data output from the first parallel-to-serial converter and second serial data delayed a preset delay time from the first serial data, a signal of an amplitude pre-emphasized responsive to transitions of logic values of the first serial data. The pre-emphasis circuit further includes a second parallel-to-serial converter receiving parallel data in common with the first parallel-to-serial converter, for converting the parallel data into serial data, the conversion timing of the second parallel-to-serial converter being delayed by a preset delay time from the conversion timing of the first parallel-to-serial converter, so that the second serial data, delayed by the preset delay time, is generated from the second parallel-to-serial converter.

The pre-emphasis circuit according to the present invention includes a mixing circuit receiving the first and second serial data output from the first and second parallel-to-serial converters, respectively, to output a signal emphasizing a change point of the first serial data, and a clock generating circuit for generating and supplying a first multi-phase clock signal composed of clock signals having mutually different phases and a second multi-phase clock signal composed of clock signals having mutually different phases to the first and second parallel-to-serial converters, respectively, wherein the first phase clock of the second multi-phase clock signal is shifted from the first phase clock of the first multi-phase clock signal by a time corresponding to the preset delay time.

In the pre-emphasis circuit according to the present invention, at least one of the first and second parallel-to-serial converters includes a plurality of switches placed in juxtaposition, receiving corresponding ones of a plurality of bit data forming the parallel data, and having output ends connected in common. The switches receive corresponding ones of the first and second multi-phase clocks and are turned on to output the bit data supplied thereto when the clock signals are of a first value, while being turned off when the clock signals are of a second value.

In the pre-emphasis circuit according to the present invention, the mixing circuit includes a first buffer receiving and driving first serial data to be serially output over a transmission line, and a second buffer receiving and driving a signal which is a delayed and inverted version of the first serial data. The output impedance of the second buffer is higher than that of the first buffer, or is controlled variably.

An interfacing circuit in another aspect of the present invention includes a serialization/deserialization circuit. The deserialization circuit includes a clock and data recovery circuit for extracting a clock signal and a data signal from the received serial data. The deserialization circuit also includes a parallel-to-serial converter for converting data from the clock and data recovery circuit into parallel data based on a synchronizing clock signal extracted from the clock and data recovery circuit. The serialization circuit for serializing the transmission parallel data to output the resulting serialized data on the transmission line includes the aforementioned pre-emphasis circuit according to the present invention.

The meritorious effects of the present invention are summarized as follows.

According to the present invention, the data delayed by one clock period is generated by parallel-to-serial conversion which is carried out in parallel. Since no differential circuit is used and hence the circuit for a high speed operation may be dispensed with, it is possible to relax timing constraints and to achieve reduction in latency and circuit size, improved operational limits and reduction in circuit parts.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention.

Accordingly, the drawing and description are to be regarded as illustrative in nature, and not as restrictive.

BRIEF DESCRIPTIONS OF THE DRAWINGS

Explanation of Numerals

PREFERRED EMBODIMENTS OF THE INVENTION

The present invention will be described in more detail with reference to the accompanying drawings. A pre-emphasis circuit according to the present invention includes first and second parallel-to-serial converters ($101_1$ and $101_2$) for receiving parallel data in common and for converting the parallel data into serial data, respectively. The conversion timing of the second parallel-to-serial converter ($101_2$) is delayed by a preset delay time from the conversion timing of the first parallel-to-serial converter ($101_1$) so that the second parallel-to-serial converter ($101_2$) outputs second serial data B delayed from the first serial data A output from the first parallel-to-serial converter ($101_1$). The pre-emphasis circuit according to the present invention also includes a mixing circuit (103) for generating, from the first and second serial data A and B, a signal, an amplitude of which undergoes pre-emphasis, on transition of the logic value of the first serial data A. The pre-emphasis circuit according to the present invention also includes a clock generating circuit (102) for generating and supplying a first set of multi-phase clocks and a second set of multi-phase clocks to the first and second parallel-to-serial converters ($101_1$ and $101_2$), respectively. The first and second sets of clocks are each made up of clocks having mutually different phases. The first phase clock of the second set of multi-phase clocks is shifted from the first phase clock of the first set of multi-phase clocks, and the second serial data B are equivalent to the first serial data A delayed by one clock period from the first serial data A.

According to the present invention, at least one of the first and second parallel-to-serial converters ($101_1$ and $101_2$) includes a plurality of juxtaposed switches ($10_1$ to $10_8$). These switches receive corresponding ones of a plurality of bit data forming the parallel data, and have output ends connected in common. The switches receive corresponding ones of the first and second multi-phase clocks. The switches are turned on to output the bit data supplied thereto when the clock signals are of a first value, while being turned off when the clock signals are of a second value. The respective clocks of the respective multi-phase clock signals are first to N'th clocks obtained on divide-by-N frequency division of a reference clock signal, and assume a first value with phase shift equal to tCLK relative to one another for a time equal to N times the reference clock period tCLK. It is noted that, although the present invention will now be described for a case where eight bit parallel data are serialized and output in this serialized form, this is merely exemplary and is not to be construed to be limiting the present invention.

Figure 1:
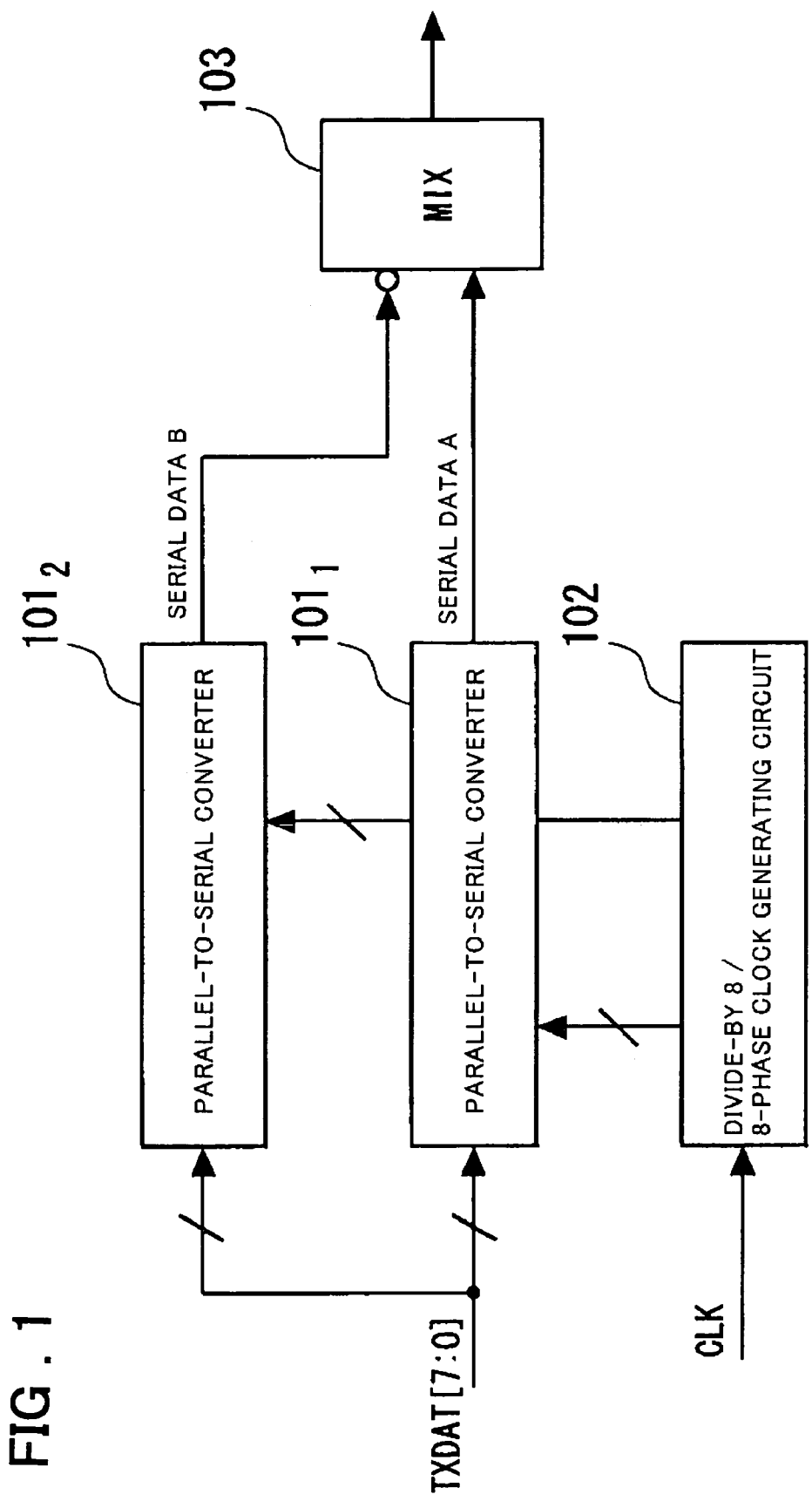
FIG. 1 shows the configuration of an embodiment of the present invention.

FIG. 1 shows the configuration of an embodiment of the present invention. Referring to FIG. 1, an embodiment of the present invention includes a divided by 8/8-phase clock generating circuit 102, a first parallel-to-serial converter $101_1$, and a second parallel-to-serial converter $101_2$. The divided by 8/8-phase clock generating circuit receives a clock signal to generate divided by eight/eight phase clocks. The first and second parallel-to-serial converters are supplied with eight phase clocks from the divided by 8/8-phase clock generating circuit 102 and with the 8-bit parallel data TXDAT[7:0] to output data serially in response to the respective phase clock pulses. The eight phase clocks have phases equally spaced from one another by a clock period tCLK, and have each a pulse width equal to tCLK. The serial data A and B, output from the first and second parallel-to-serial converters $101_1$ and $101_2$, are supplied to a mixing circuit (MIX) 103. It is now assumed that first multi-phase clocks (CLK0, CLK1, CLK2, . . . , and CLK7) are supplied as eight phase clocks from the divided by 8/8-phase clock generating circuit 102 to the first parallel-to-serial converter $101_1$ which outputs the serial data A. In this case, second multi-phase clocks (CLK1, CLK2, . . . CLK7, and CLK0), phase-delayed from the first multi-phase clocks by one clock period tCLK, are supplied to the second parallel-to-serial converter $101_2$ which generates the serial data B. That is, the first phase clock of the first parallel-to-serial converter $101_1$ is CLK0, while the first phase clock of the second parallel-to-serial converter $101_2$ is CLK1.

Meanwhile, the first parallel-to-serial converter $101_1$ and the second parallel-to-serial converter $101_2$ convert the 8-bit parallel data TXDAT [7:0] into serial bits. However, the present invention is not limited to this configuration. For example, if the 4 bit parallel data TXDAT [3:0] is converted into serial bits, the divided by 8/8-phase clock generating circuit 102, generating divided by eight/eight phase clocks, is replaced by a divided by 4/4-phase clock generating circuit, generating divided by four/four phase clocks.

Figure 10:
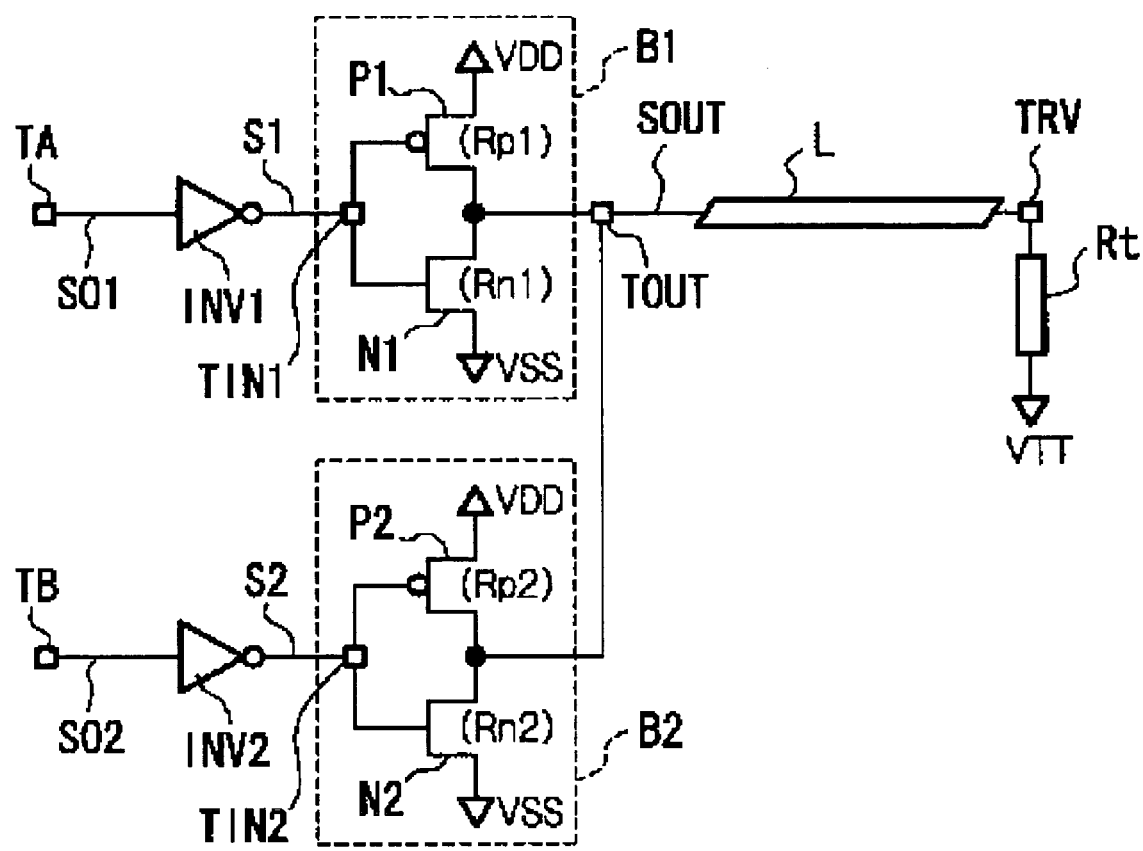
FIG. 10 is a diagram showing the configuration of a pre-emphasis circuit according to the related art.
Figure 11:
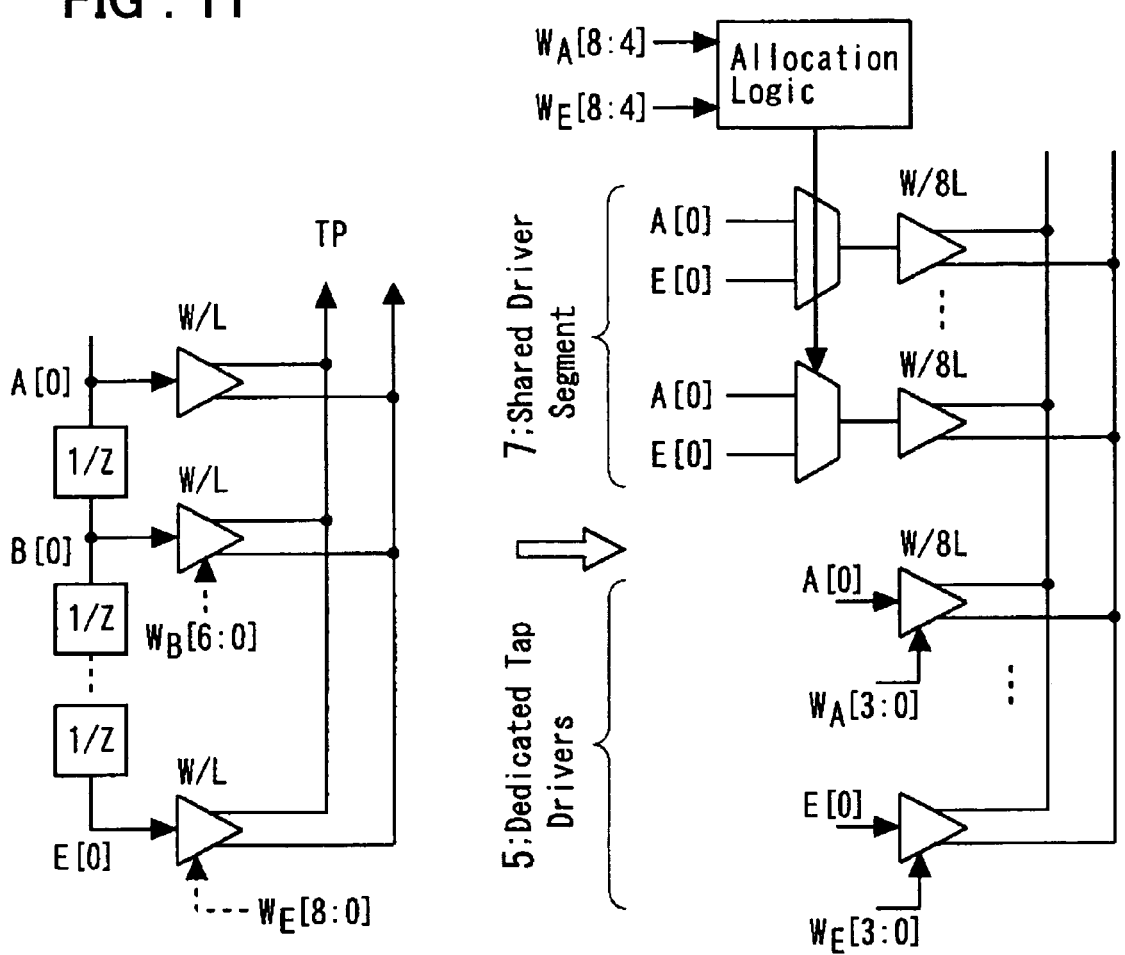
FIG. 11 is a diagram showing the configuration of a 2-PAM/4-PAM equalizing transmitter.
Figure 12:
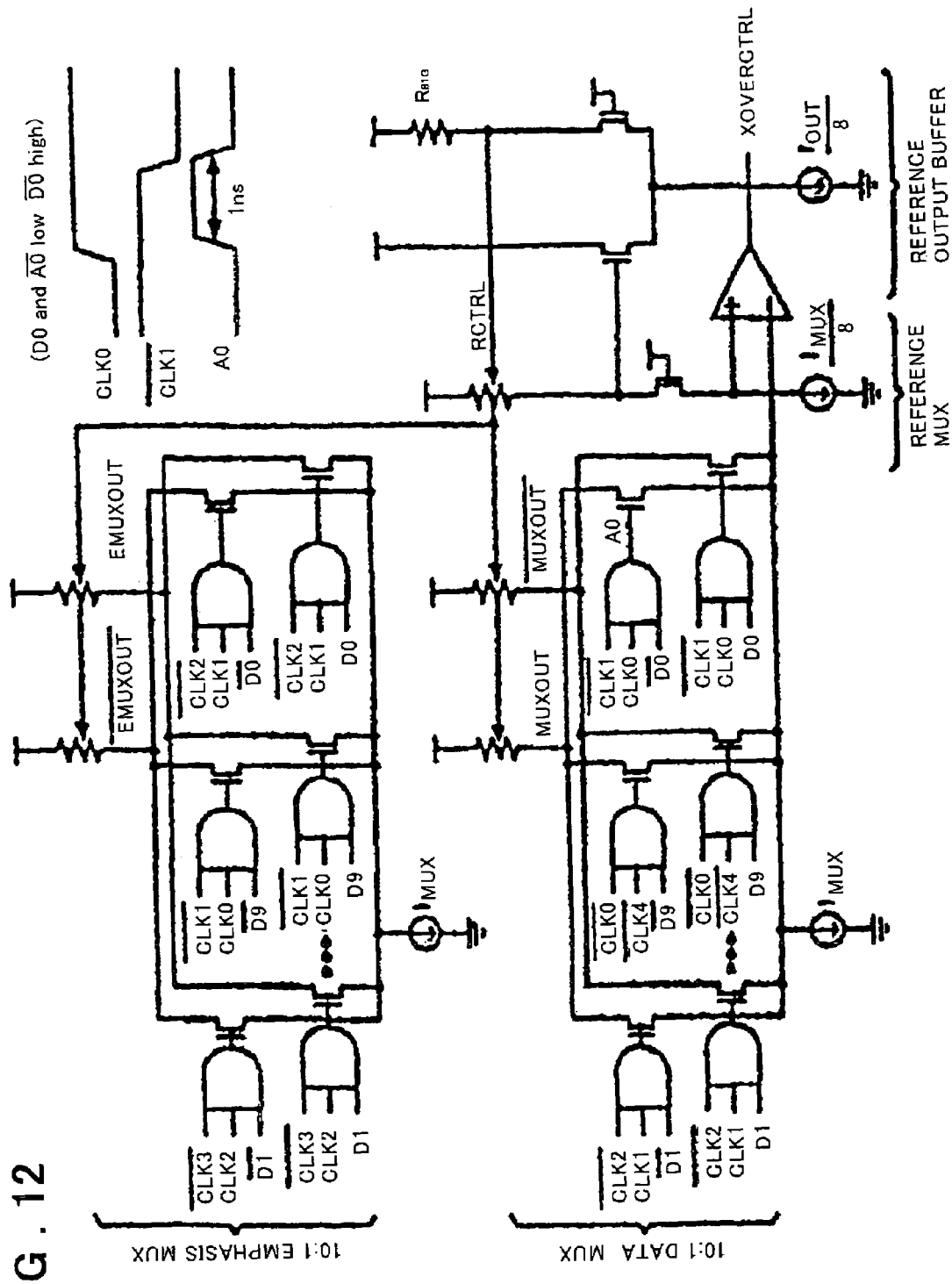
FIG. 12 is a diagram showing the configuration of a circuit for converting parallel data into serial data to carry out pre-emphasis.

The mixing circuit (MIX) 103 of FIG. 1 may include a first inverter (INV1 of FIG. 10), a first output buffer (B1 of FIG. 10), a second inverter (INV2 of FIG. 10) and a second output buffer (B2 of FIG. 10), as shown for example in FIG. 10. The first inverter may receive serial data (SO1 of FIG. 10), as input, and the first output buffer may receive an output of the first inverter as input. The second inverter may receive an inversion of the serial data B (SO2 of FIG. 10), as input, and the second output buffer may receive an output of the second inverter, as input. The impedance of the second output buffer may be set so as to be higher than that of the first output buffer. Or, the above first buffer (B1 of FIG. 10) and another buffer, the output impedance of which is changed by an emphasis control signal and its inverted signal, may be provided, and the outputs of these buffers may be connected in common. That is, an alternative configuration disclosed in Patent Document 2 or an optional configuration disclosed in the aforementioned Non-Patent Document 1, for example, may also be used.

Figure 2A:
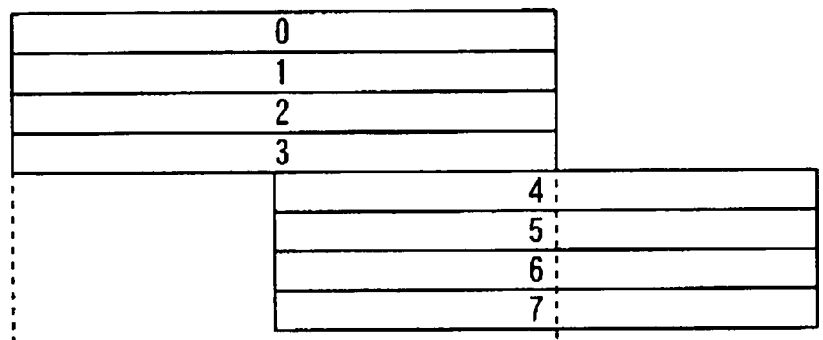
FIGS. 2A to 2D are diagrams for illustrating the operation of the embodiment of the present invention.
Figure 2B:
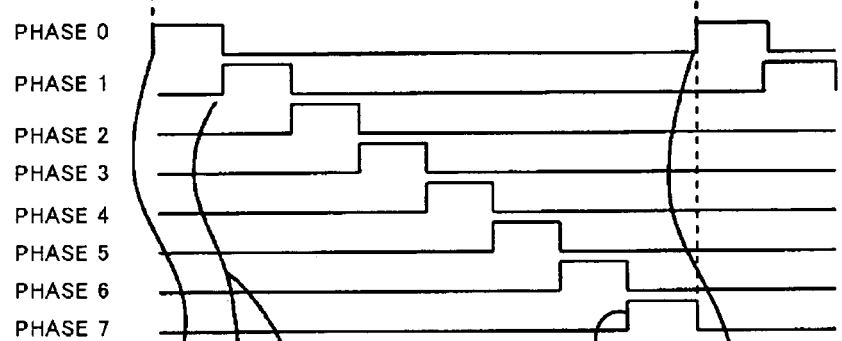

FIGS. 2A to 2D illustrate the operation of an embodiment of the present invention shown in FIG. 1. Specifically, FIG. 2A shows 8-bit parallel data (transmission data) TXDAT [7:0], and FIG. 2B shows 8:1 frequency divided eight phase clocks supplied to the first parallel-to-serial converter $101_1$. It should be noted that, as for the 8-bit parallel data (transmission data) TXDAT [7:0], the output holding timing for TXDAT[3:0] is shifted from that for TXDAT[7:4] because of outputting the eighth bit data XDAT7 in the serial data B. It is however possible to shift by one clock period only the eighth bit data XDAT7.

Figure 2C:
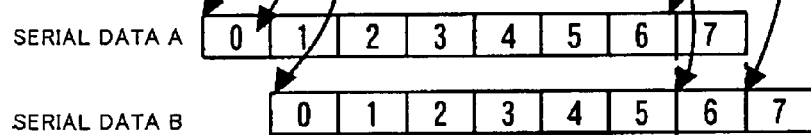
Figure 2D:
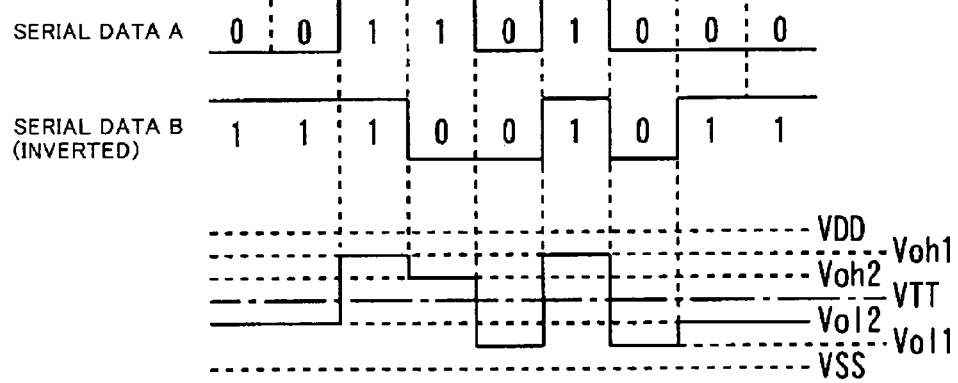

FIG. 2C shows the timing relationship between the serial data A from the first parallel-to-serial converter $101_1$ and the serial data B from the second parallel-to-serial converter $101_2$. FIG. 2D shows examples of waveforms of the serial data A and B and an example of the waveform of the output signal of the mixing circuit (MIX) 103.

Referring to FIG. 2D, in case the serial data A (current bit) is 1 and an inverted bit of the serial data B as delayed data is 1, pre-emphasis is applied to the signal of the logic 1 to be supplied, so that the magnitude of the signal voltage is set to a level Voh1 (HIGH level during pre-emphasis), where Voh1<(power supply voltage VDD).

When the serial data (current bit) is 1 and the inversion of the serial data B is 0, de-emphasis is applied to the signal of the logic 1 to be output. Thus, the magnitude of the signal voltage is set to a level range between Voh1 and Voh2, which level range is the HIGH level during de-emphasis, where VTT<Voh2<Voh1. VTT in FIG. 2D denotes a terminating potential of the transmission line L (see FIG. 10).

When the serial data (current bit) is 0 and the serial data B (inverted pre-bit) is 0, pre-emphasis is applied to signal of the logic 1 to be output. Thus, the magnitude of the signal voltage is set to a level Vol1 (LOW level during de-emphasis) where Vol1>power supply voltage VSS.

When the serial data A (current bit) is 0 and an inversion of the serial data B is 1, de-emphasis is applied to the signal of the logic 0 to be output, and hence the magnitude of the signal voltage is set to a level range between Vol1 and Vol2, which level range is the LOW level during de-emphasis, where VSS<Vol1<Vol2<VTT.

Figure 3:
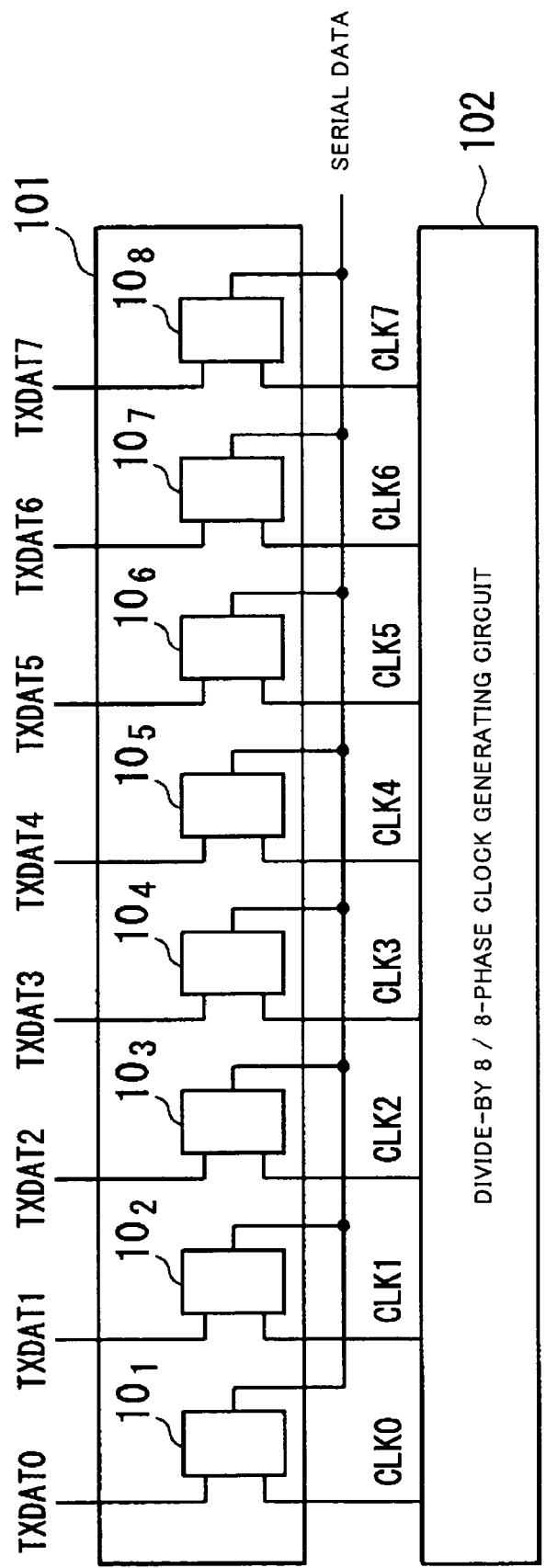
FIG. 3 is a diagram showing the configuration of a parallel-to-serial converter according to an embodiment of the present invention.

FIG. 3 shows an illustrative configuration of the parallel-to-serial converter $101_1$ or $101_2$ according to an embodiment of the present invention. Referring to FIG. 3, this parallel-to-serial converter includes eight switches $10_1$ to $10_8$ which are all of the same configuration. These switches receive 8-bit parallel data TXDAT0 to TXDAT7, as inputs, while also receiving eight phase clocks CLK0 to CLK7 from the divided by 8/8-phase clock generating circuit 102 of FIG. 1. The outputs of the switches $10_1$ to $10_8$ are connected in common. The switches $10_1$ to $10_8$ output data, supplied thereto as input, during the HIGH level periods of the input clock signals CLK0 to CLK7. The switches $10_1$ to $10_8$ are in an off-state during the LOW level periods of the input clock signals CLK0 to CLK7, with the outputs of the switches being in a high impedance state. Referring to FIG. 2B, the clock signals of the first to eighth phases CLK0 to CLK7 are generated from frequency divided clocks, obtained on division of the clock signal CLK, and are phase-shifted by tCLK from one another. The clock signal is at HIGH level during tCLK and the HIGH level periods of the clock signals are not overlapped with one another. Hence, bit data TXDAT0 to TXDAT7 are sequentially serially output, every clock cycle tCLK, for input 8-bit parallel data (TXDAT0 to TXDAT7). FIG. 4 shows two illustrative configurations of the switches $10_1$ to $10_8$.

Figure 4A:
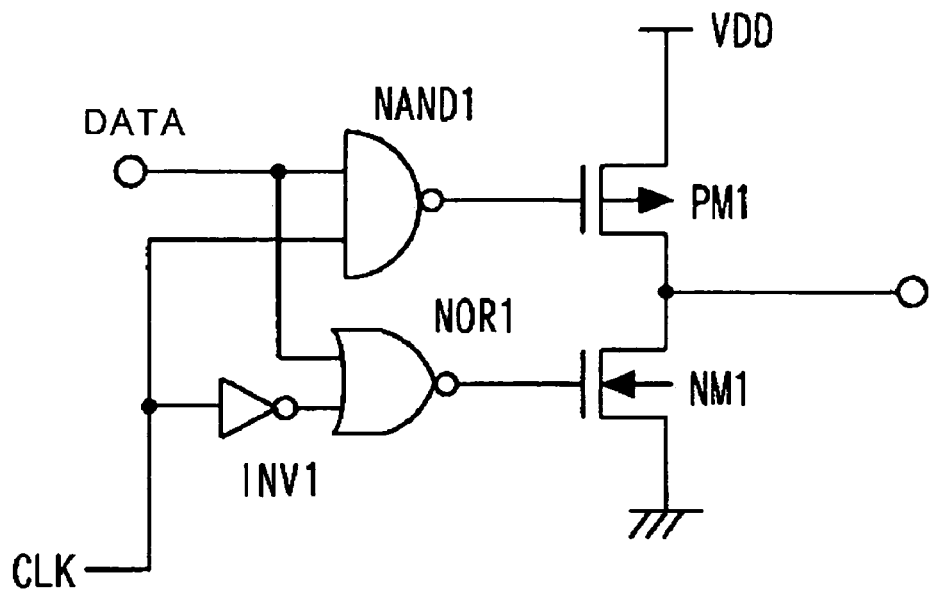
FIGS. 4A and 4B are diagrams showing two illustrative structures of a switch used in the parallel-to-serial converter of FIG. 3.
Figure 4B:
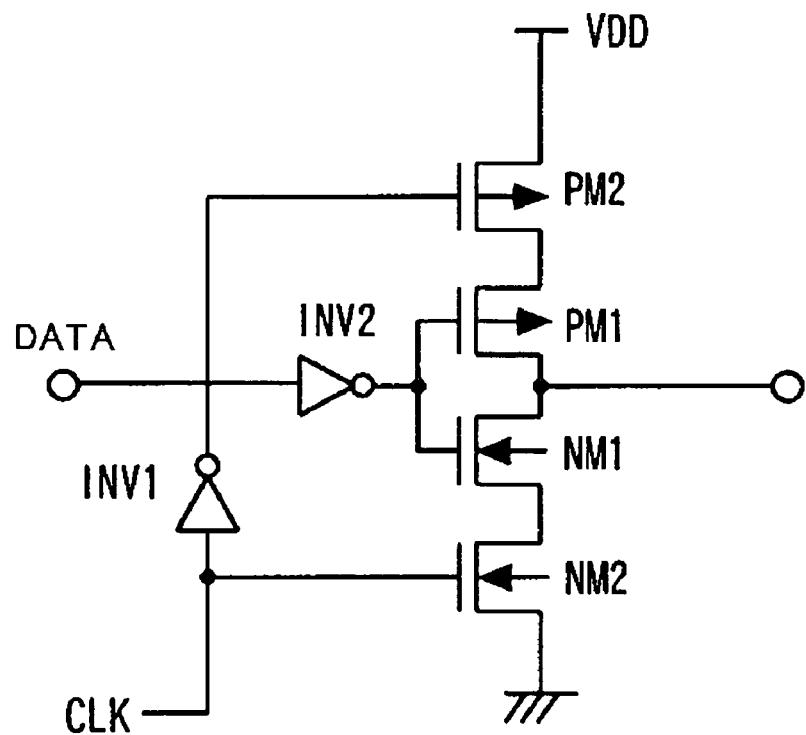

The configuration of FIG. 4A includes a PMOS transistor PM1 and an NMOS transistor NM1, connected in series with each other between the power supply and GND, a NAND circuit NAND1, receiving a data signal and the clock signal CLK, as inputs, and a NOR circuit NOR1, receiving the data signal and an inversion of the clock signal CLK, that is, an output of an inverter INV1. Outputs of the NAND circuit NAND1 and the NOR circuit NOR1 are supplied to the gates of the PMOS transistor PM1 and the NMOS transistor NM1, respectively. If, when the clock signal CLK is HIGH, the data is HIGH, the output of the NAND circuit NAND1 becomes LOW, the output of the NOR circuit NOR1 also becoming LOW. The PMOS transistor PM1 is turned on, while the NMOS transistor NM1 is turned off, with the output then becoming HIGH. If the data becomes LOW, the output of the NAND circuit NAND1 becomes HIGH, the output of the NOR circuit NOR1 also becoming HIGH. The PMOS transistor PM1 is turned off, while the NMOS transistor NM1 is turned on, with the output then becoming LOW. Alternatively, the switch may be configured by a clocked inverter in which an NMOS transistor NM2, a PMOS transistor PM2, a PMOS transistor PM1 and an NMOS transistor NM1 are arranged between the power supply and the GND, in the order of PM2, PM1, NM1 and NM2, as shown in FIG. 4B. The NMOS transistor NM2 and the PMOS transistor PM2 are turned on or off by the clock signal CLK and an inverted signal thereof, while the data signal, inverted by an inverter INV2, is supplied to the gates of the PMOS transistor PM1 and an NMOS transistor NM1. The switches $10_1$ to $10_8$ may be configured by an optional three-state non-inverting buffer other than the configuration shown in FIGS. 4A and 4B.

Figure 5:
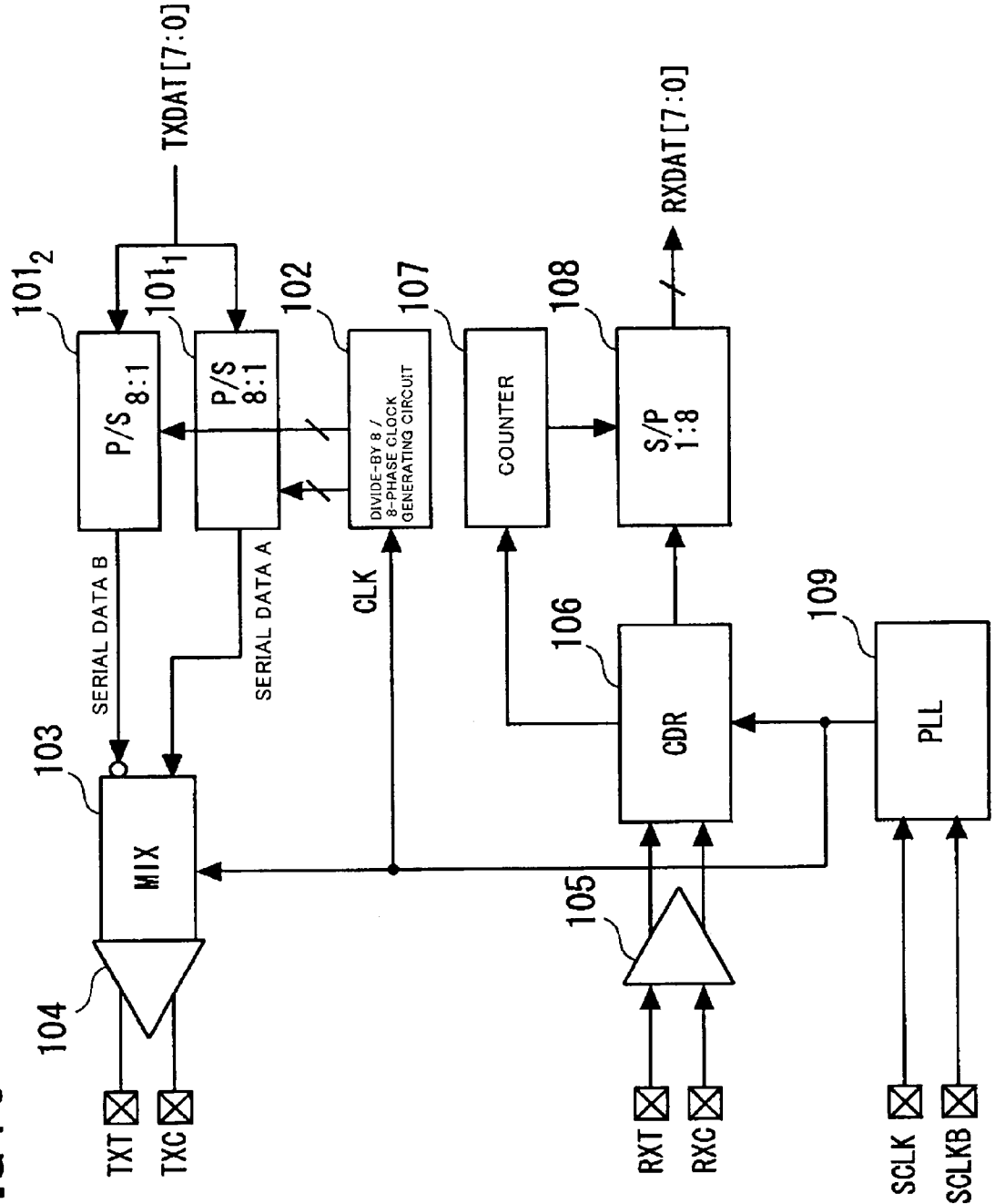
FIG. 5 is a diagram showing the configuration of a serial interfacing circuit according to an embodiment of the present invention.
Figure 6:
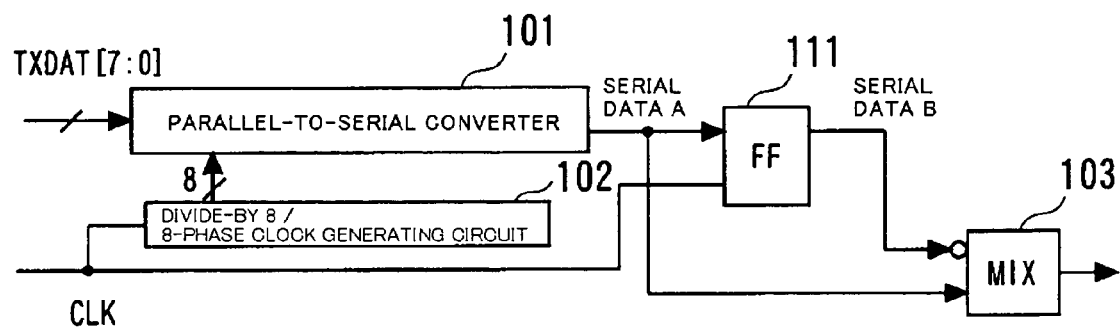
FIG. 6 is a diagram showing a configuration of a pre-emphasis circuit according to the related art.
Figure 7:
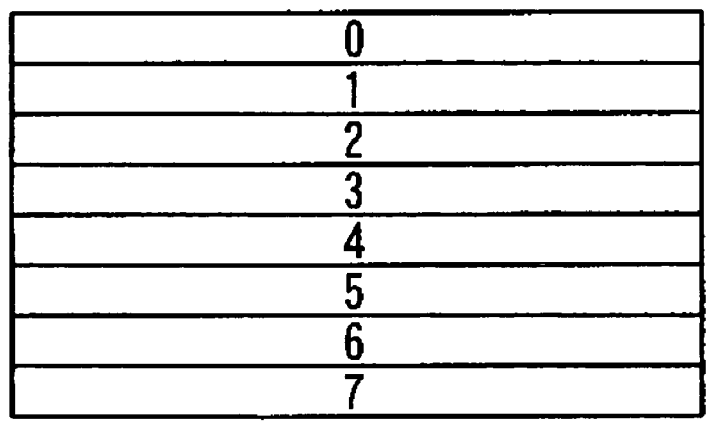
FIG. 7 is a diagram for illustrating the operation of the circuit of FIG. 6.
Figure 7:
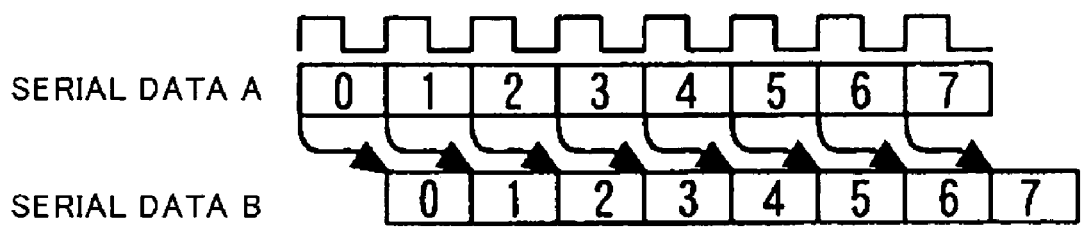
Figure 8:
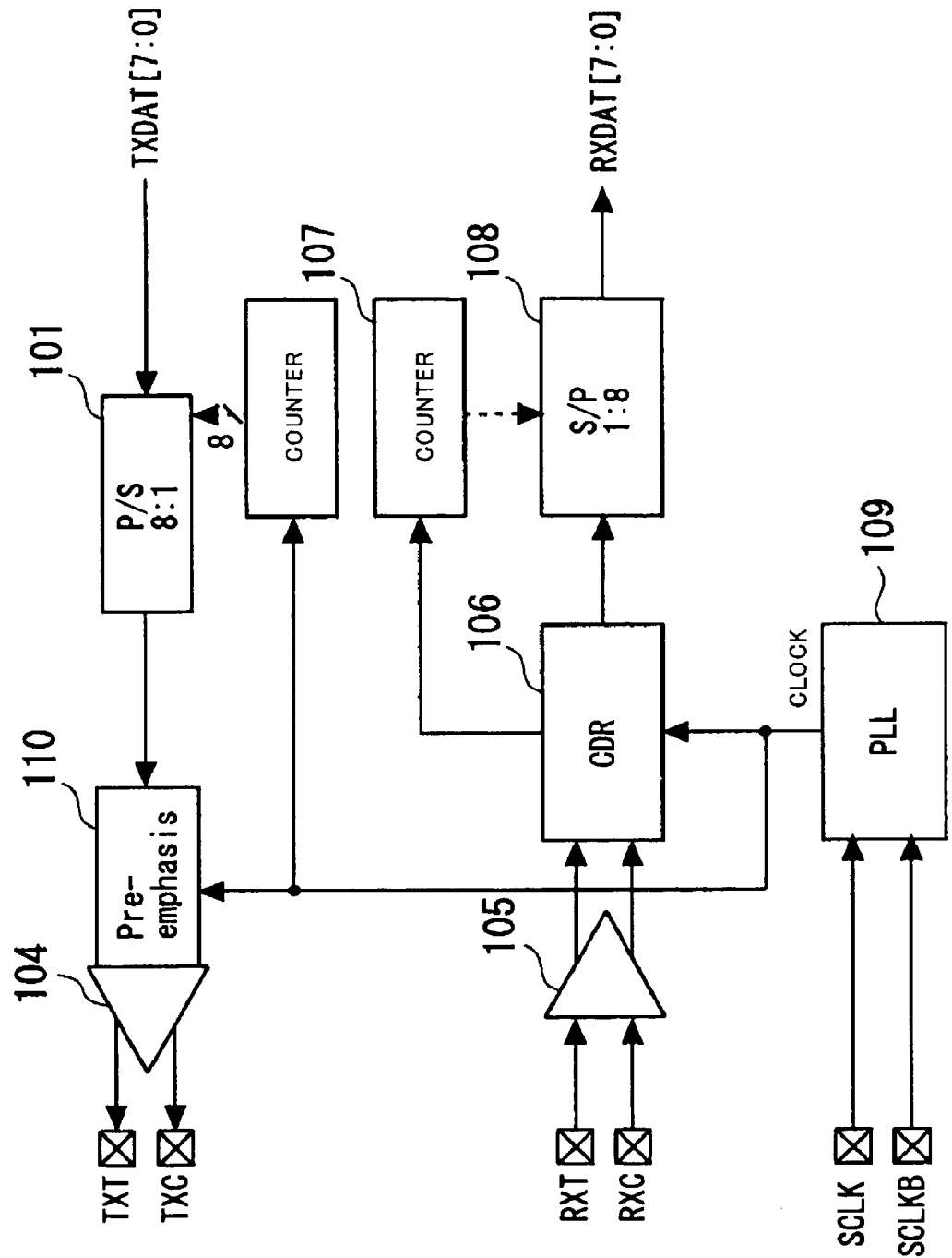
FIG. 8 is a diagram showing the configuration of a serial interfacing circuit according to the related art.
Figure 9:
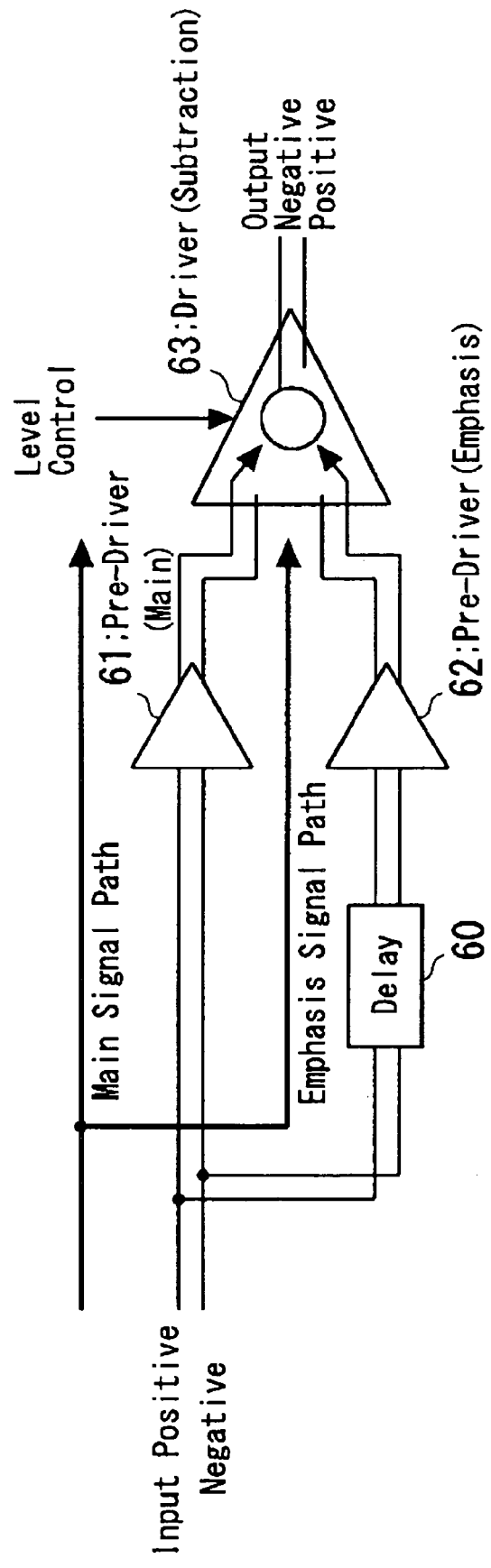
FIG. 9 is a diagram showing an arrangement of a buffer having the function of pre-emphasis according to the related art.

FIG. 5 shows a configuration of an interface (serialization/deserialization) having a pre-emphasis circuit according to an embodiment of the present invention. As a deserialization circuit, the interface includes an input buffer 105 for receiving differential data RXT, RXC, and a clock and recovery circuit (CDR circuit) 106 for extracting data and clocks synchronized with the input data. Serial data from the clock and recovery circuit 106 are converted by the serial-to-parallel converter 108 into received parallel data RXDAT [7:0], which received parallel data RXDAT [7:0] is supplied to an internal circuit, not shown. When the interface is mounted on a DIMM (Dual Inline Memory Module), the received parallel data is supplied from the interface to a memory. An output of the counter 107, adapted for generating frequency-divided clocks based on the clocks from the clock and recovery circuit 106, is supplied to the serial-to-parallel converter 108, which then outputs received parallel data RXDAT[7:0] every eight clocks as a cycle.

In the serialization circuit, the first and second parallel-to-serial converters $101_1$, $101_2$ convert the transmission parallel data TXDAT[7:0] into serial data A and into serial data B, delayed by one clock period from the serial data A, as already described with reference to FIG. 1. The serial data A, B are supplied to the mixing circuit (MIX) 103. The divided by 8/8-phase clock generating circuit 102 is the same as the divided by 8/8-phase clock generating circuit 102 of FIG. 1, and receives an internal clock signal from the PLL circuit 109 in turn receiving system clocks SCLK. The internal clock signal is phase-synchronized with the system clock SCLK. The divided by 8/8-phase clock generating circuit 102 frequency divides the internal clock signal by 8:1 frequency division to generate a first set of eight-phase clocks and a second set of eight-phase clocks phase-shifted by one clock period from the first set of the eight-phase clocks. These first and second sets of the eight-phase clocks are supplied to the first and second parallel-to-serial converters $101_1$, $101_2$, respectively. In case the mixing circuit (MIX) 103 output a single in a single ended way, the differential circuit (output buffer) 104 receives the single-ended output to output the data differentially.

Although the present invention has so far been described with reference to the preferred embodiments, the present invention is not limited to the particular configurations of these embodiments. It will be appreciated that the present invention may encompass various changes or corrections such as may readily be arrived at by those skilled in the art within the scope and the principle of the invention. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A pre-emphasis circuit comprising:
a first parallel-to-serial converter, receiving parallel data, for converting said parallel data to first serial data for output;
a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;
a second parallel-to-serial converter, receiving said parallel data in common with said first parallel-to-serial converter, for converting said parallel data to second serial data for output; and
a circuit for delaying the conversion timing of said second parallel-to-serial converter by said preset delay time from the conversion timing of said first parallel-to-serial converter;
said second serial data delayed by said preset delay time, which is received by said mixing circuit, being generated by said second parallel-to-serial converter, wherein said second serial data is delayed by one clock period from said first serial data.

2. A pre-emphasis circuit comprising:
a first parallel-to-serial converter, receiving parallel data, for converting said parallel data to first serial data for output;
a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;
a second parallel-to-serial converter, receiving said parallel data in common with said first parallel-to-serial converter, for converting said parallel data to second serial data for output; and
a circuit for delaying the conversion timing of said second parallel-to-serial converter by said preset delay time from the conversion timing of said first parallel-to-serial converter;
said second serial data delayed by said preset delay time, which is received by said mixing circuit, being generated by said second parallel-to-serial converter,
wherein said circuit for delaying the conversion timing of said second parallel-to-serial converter includes a clock generating circuit for generating and supplying a first multi-phase clock signal composed of clock signals having mutually different phases and a second multi-phase clock signal composed of clock signals having mutually different phases to said first parallel-to-serial converter and said second parallel-to-serial converter, respectively,
the first phase clock of said second multi-phase clock signal being shifted from the first phase clock of said first multi-phase clock signal by a time corresponding to said preset delay time.

3. A pre-emphasis circuit comprising:
a first parallel-to-serial converter, receiving parallel data, for converting said parallel data to first serial data for output;
a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;
a second parallel-to-serial converter, receiving said parallel data in common with said first parallel-to-serial converter, for converting said parallel data to second serial data for output; and
a circuit for delaying the conversion timing of said second parallel-to-serial converter by said preset delay time from the conversion timing of said first parallel-to-serial converter;
said second serial data delayed by said preset delay time, which is received by said mixing circuit, being generated by said second parallel-to-serial converter,
wherein at least one of said first and second parallel-to-serial converters includes a plurality of switches placed in juxtaposition; said switches receiving corresponding ones of a plurality of bit data forming said parallel data, as inputs, and having output ends connected in common; said switches receiving corresponding ones of said first and second multi-phase clocks for being turned on to output the bit data supplied thereto when said clock signals are of a first value and for being turned off when said clock signals are of a second value.

4. A pre-emphasis circuit comprising:
a first parallel-to-serial converter, receiving parallel data, for converting said parallel data to first serial data for output;
a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;
a second parallel-to-serial converter, receiving said parallel data in common with said first parallel-to-serial converter, for converting said parallel data to second serial data for output; and a circuit for delaying the conversion timing of said second parallel-to-serial converter by said preset delay time from the conversion timing of said first parallel-to-serial converter;

said second serial data delayed by said preset delay time, which is received by said mixing circuit, being generated by said second parallel-to-serial converter, wherein, if, under the condition that said mixing circuit is outputting a signal of a pre-emphasized amplitude, the logic value of the next following serial data is not changed, said mixing circuit outputs a signal of a de-emphasized amplitude.

5. A pre-emphasis circuit comprising:

a first parallel-to-serial converter, receiving parallel data, for converting said parallel data to first serial data for output;

a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;

a second parallel-to-serial converter, receiving said parallel data in common with said first parallel-to-serial converter, for converting said parallel data to second serial data for output; and a circuit for delaying the conversion timing of said second parallel-to-serial converter by said preset delay time from the conversion timing of said first parallel-to-serial converter;

said second serial data delayed by said preset delay time, which is received by said mixing circuit, being generated by said second parallel-to-serial converter, wherein said mixing circuit includes a first buffer and a second buffer for receiving said first serial data and a signal corresponding to inversion of bit data of said second serial data, respectively;

said first and second buffers having outputs connected in common;

said second buffer having an output impedance higher than an output impedance of said first buffer or having an output impedance variably controlled by a control signal controlling the emphasis.

6. A semiconductor device including a pre-emphasis circuit which comprises:

first and second parallel-to-serial converters, receiving parallel data in common, for converting said parallel data into serial data, respectively;

a circuit for delaying the conversion timing of said second parallel-to-serial converter by a preset delay time from the conversion timing of said first parallel-to-serial converter, so that said second parallel-to-serial converter outputs second serial data delayed from first serial data output from said first parallel-to-serial converter, wherein said second serial data is delayed by one clock period from said first serial data; and a circuit, receiving said first and second serial data output from said first and second parallel-to-serial converters, for generating a signal obtained on emphasizing an amplitude at a change point of said first serial data for output, based on said first and second serial data.

7. A semiconductor device including a pre-emphasis circuit which comprises:

first and second parallel-to-serial converters, receiving parallel data in common, for converting said parallel data into serial data, respectively;

a circuit for delaying the conversion timing of said second parallel-to-serial converter by a preset delay time from the conversion timing of said first parallel-to-serial converter, so that said second parallel-to-serial converter outputs second serial data delayed from first serial data output from said first parallel-to-serial converter; and a circuit, receiving said first and second serial data output from said first and second parallel-to-serial converters, for generating a signal obtained on emphasizing an amplitude at a change point of said first serial data for output, based on said first and second serial data, wherein, if, under the condition that the pre-emphasis circuit is outputting a signal of the emphasized amplitude, the logic value of the next following first serial data is not changed, said pre-emphasis circuit outputs a signal with a deemphasized amplitude.

8. A serial interfacing circuit comprising:

a clock and data recovery circuit for extracting a clock signal and a data signal from received serial data;

a circuit for converting data from said clock and data recovery circuit into parallel data, based on a synchronizing clock signal extracted from said clock and data recovery circuit; and a pre-emphasis circuit for outputting transmission data over a transmission line, the pre-emphasis circuit comprising:

a first parallel-to-serial converter, receiving parallel data, for converting said parallel data to first serial data for output;

a mixing circuit, receiving said first serial data output from said first parallel-to-serial converter and second serial data delayed by a preset delay time from said first serial data, for generating a signal, an amplitude thereof undergoing pre-emphasis responsive to a transition of said first serial data;

a second parallel-to-serial converter, receiving said parallel data in common with said first parallel-to-serial converter, for converting said parallel data to second serial data for output; and a circuit for delaying the conversion timing of said second parallel-to-serial converter by said preset delay time from the conversion timing of said first parallel-to-serial converter;

said second serial data delayed by said preset delay time, which is received by said mixing circuit, being generated by said second parallel-to-serial converter.

* * * * *